United States Patent [19]

Botez

[11] 4,393,504
[45] Jul. 12, 1983

[54] HIGH POWER SEMICONDUCTOR LASER
[75] Inventor: Dan Botez, Mt. Holly, N.J.
[73] Assignee: RCA Corporation, New York, N.Y.
[21] Appl. No.: 295,511
[22] Filed: Aug. 24, 1981
[51] Int. Cl.³ .............................................. H01L 3/19
[52] U.S. Cl. ...................................... 372/45; 357/17; 372/46
[58] Field of Search ................ 372/44, 45, 46; 357/17
[56] References Cited

U.S. PATENT DOCUMENTS

| | | | |
|---|---|---|---|
| 3,701,047 | 10/1972 | Caplan et al. .................... | 331/94.5 |
| 3,753,801 | 8/1973 | Lockwood et al. ................ | 148/171 |
| 4,048,627 | 9/1977 | Ettenberg et al. .................... | 357/17 |
| 4,092,659 | 5/1978 | Ettenberg ............................. | 357/18 |
| 4,116,733 | 9/1978 | Olsen et al. ......................... | 148/175 |
| 4,121,177 | 10/1978 | Tsukada ......................... | 331/94.5 H |
| 4,124,826 | 11/1978 | Dixon et al. .................... | 331/94.5 H |
| 4,178,564 | 12/1979 | Ladany et al. ................ | 331/94.5 H |
| 4,215,319 | 7/1980 | Botez ............................. | 331/94.5 H |
| 4,270,096 | 5/1981 | Hayashi et al. ................ | 331/94.5 H |
| 4,340,967 | 7/1982 | Dixon et al. ........................... | 372/46 |

Primary Examiner—James W. Davie
Attorney, Agent, or Firm—Birgit E. Morris; Donald S. Cohen; William J. Burke

[57] ABSTRACT

A semiconductor laser having anti-guiding regions extending through the second confinement layer towards but not intersecting the active layer on both sides of the region of the confinement layer over a land between the grooves in the substrate. These anti-guiding regions serve to suppress higher order lateral optical modes by creating large radiative losses for these modes.

8 Claims, 3 Drawing Figures

HIGH POWER SEMICONDUCTOR LASER

The Government has rights in this invention pursuant to a Government Contract.

The invention relates to a semiconductor laser capable of higher output power in the fundamental lateral mode.

BACKGROUND OF THE INVENTION

Botez, in U.S. Pat. No. 4,215,319, incorporated herein by reference, has disclosed a semiconductor laser which comprises a body of semiconductor material with a pair of spaced, substantially parallel grooves in a surface thereof with a land between the grooves. A first confinement layer overlies the surface of the substrate and the surfaces of the grooves, an active layer overlies the first confinement layer and a second confinement layer overlies the active layer. The active layer has a uniform thickness over the land and tapers in thickness in the lateral direction, i.e. the direction in the plane of the surface of the substrate and perpendicular to the axis of the grooves. The active layer is the recombination region of the laser with the light beam being generated and propagating in the portion of the active layer over the land. Botez, in U.S. patent application Ser. No. 251,651, U.S. Pat. No. 4,347,486, which is incorporated herein by reference, has disclosed a semiconductor laser which comprises the laser described above having a guide layer interposed between the first confinement layer and the active layer. The guide layer has an index of refraction less than that of the active layer but greater than that of either the first or second confinement layers so that a light beam generated in the active region propagates both in the thin active region and the relatively thicker guide layer, thereby forming a lasing mode having a significantly larger cross-sectional area.

Both of these lasers emit light in the lowest order lateral mode over ranges of output powers which depend on the particular laser type. Above these ranges of powers the gain and confinement of the higher order lateral modes are such that the lasers begin to emit light in these higher order lateral modes. It would be desirable to increase the discrimination against the higher order lateral modes, thereby increasing the range of output powers for which both lasers emit in only the lowest order lateral mode.

SUMMARY OF THE INVENTION

The invention is an improved semiconductor laser where the improvement comprises anti-guiding regions having an index of refraction greater than that of the second confinement layer and which extend through the second confinement layer towards the active layer on both sides of that portion of the active layer over the portion of the substrate surface between the grooves. The anti-guiding regions introduce a large radiative loss for higher order lateral modes, thereby discriminating against laser emission in these modes.

DETAILED DESCRIPTION OF THE INVENTION

Figure 1:
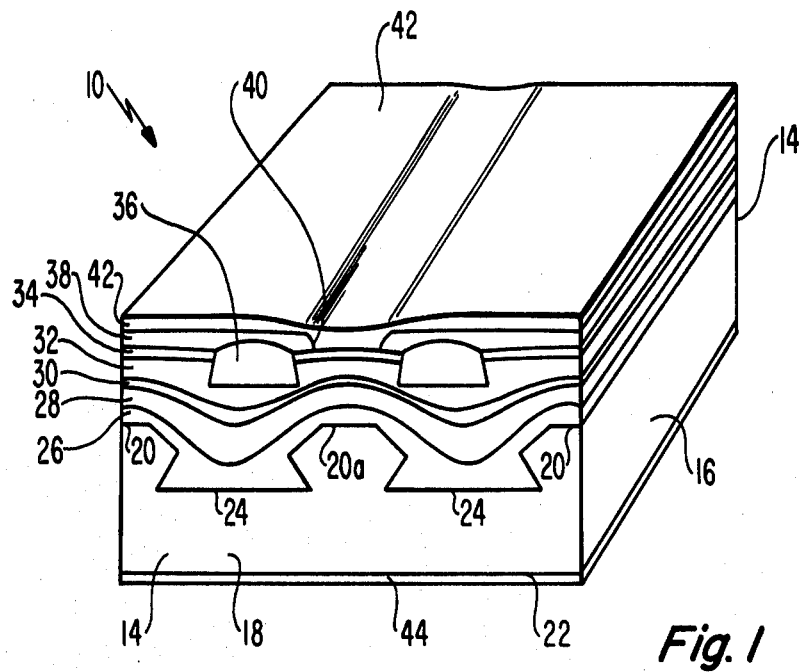
FIGS. 1 and 2 are plan views, respectively, of first and second embodiments of the semiconductor laser of the invention.

Referring to FIG. 1, a semiconductor laser 10 comprises a parallelopiped of semiconductor material having spaced, parallel end faces 14, which are partially reflecting of light and at least one of which is partially transparent so that light may be emitted therefrom, and spaced, parallel side surfaces 16 which extend between and are perpendicular to the end faces 14. The semiconductor laser 10 includes a substrate 18 having spaced, parallel major surfaces 20 and 22 which extend between and are perpendicular to both the end faces 14 and the side surfaces 16. In the surface 20 are a pair of spaced, parallel grooves 24 which extend between the end faces 14 with the portion of the surface 20 between the grooves 24 forming a land 20a. A buffer layer 26 overlies the surface 20, the land 20a, and partially fills each of the grooves 24. A first confinement layer 28 overlies the buffer layer 26. An active layer 30 overlies the surface of the first confinement layer 28 with the portion of the active layer 30 over the land 20a tapering in decreasing thickness in the lateral direction. A second confinement layer 32 overlies the active layer 30 and a capping layer 34 overlies the second confinement layer 32. A pair of spaced apart, substantially parallel antiguiding regions 36 extend through the capping and second confinement layers 34 and 32, respectively, towards, but not intersecting, the active region 30 to either side of that portion of the second confinement layer 32 over the land 20a. An electrically insulating layer 38 overlies the capping layer 34 and the anti-guiding regions 36 and has an opening 40 therethrough in the form of a stripe extending between the end faces 14 over the land 20a. An electrical contact 42 overlies the electrically insulating layer 38 and the portion of the capping layer 34 in the region of the opening 40. A second electrical contact 44 overlies the second surface 22 of the substrate 18.

The substrate 18, the buffer layer 26 and the first confinement layer 28 are of one conductivity type and the second confinement layer 32 and the capping layer 34 are of the opposite conductivity type. The anti-guiding regions 36 may be of either conductivity type but preferably are of the opposite conductivity type to that of the second confinement layer 32. The materials which compose the active layer 30 and the first and second confinement layers 28 and 32 respectively are so chosen that the index of refraction of the active layer 30 at the wavelength of the light emitted by the laser is greater than that of the first and second confinement layers 28 and 32 respectively. The index of refraction of the anti-guiding regions 36 is greater than that of the second confinement layer 32.

Figure 3:
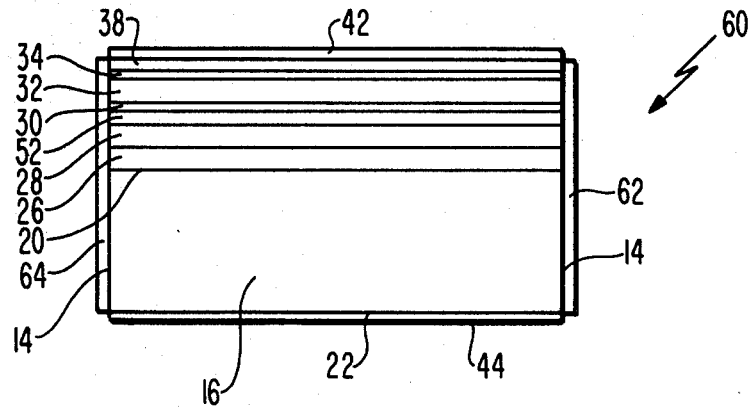
FIG. 3 is a side view of a third embodiment of the semiconductor laser of the invention.
Figure 2:
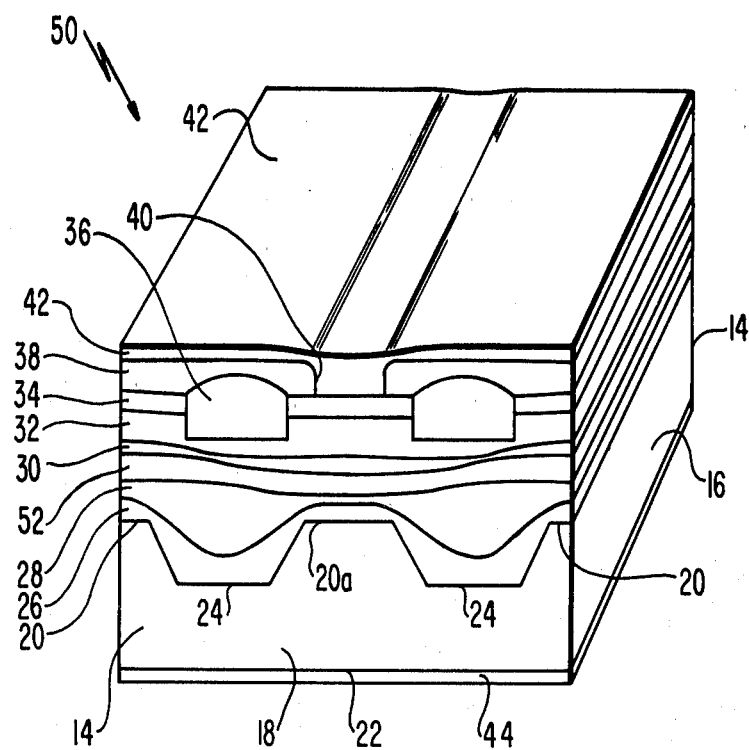

In FIGS. 2 and 3 the identification of the common elements of the semiconductor lasers 50 and 60 respectively and the semiconductor laser 10 in FIG. 1 is the same.

Referring to FIG. 2, the laser 50 differs from the laser 10 of FIG. 1 in that a guide layer 52 is interposed between the first confinement layer 28 and the active layer 30. The guide layer 52 is of the same conductivity type as the first confinement layer 28 and has an index of refraction at the wavelength of light emitted by the laser which is intermediate between that of the active layer 30 and the first confinement layer 28.

Referring to FIG. 3, the laser 60 differs from the laser 50 of FIG. 2 in that a light reflector 62 overlies one of the end faces 14 and a passivation layer 64 overlies the opposed end face 14 of the laser 50. The light reflector 62 may be such as that disclosed by Caplan et al in U.S. Pat. No. 3,701,047 or by Ettenberg in U.S. Pat. No. 4,092,659. The passivation layer 64 may be a layer of $Al_2O_3$ or similar material having an optical thickness of about one-half wave at the wavelength of the light emitted by the device as disclosed by Ladany et al in U.S. Pat. No. 4,178,564. The patents of Caplan et al, Ettenberg and Ladany et al, referred to above, are incorporated herein by reference.

The substrate 18 is typically composed of a binary Group III-V compound, preferably n-type GaAs whose surface 20 is parallel to the {100} crystallographic plane. The substrate may be slightly misoriented from this orientation but preferably the {100} plane is used. In the selection of the substrate and the layers deposited thereon it is desirable that the layers be lattice matched to the substrate, i.e., the different layers have the same crystallographic structure and preferably have differences in their lattice constants of less than 0.1%.

The grooves 24 are shown in FIG. 1 as having a dovetail shape and in FIG. 2 as having a vee shape. The only requirement for the shape of the grooves is that, during the deposition of the overlying layers, the cooperative effect of the grooves is to produce the desired thickness and taper of the overlying layers. The grooves 24 may be between about 4 and 12 micrometers ($\mu$m) wide at the surface 20, are typically about 10 $\mu$m wide, and have a depth of about 4 $\mu$m. The spacing of the grooves may be between about 20 and about 45 $\mu$m and is typically about 32 $\mu$m. The grooves are formed using standard photolithographic and chemical etching techniques as disclosed, for example, by Botez in U.S. Pat. No. 4,215,319, referred to above. The grooves preferably have their axis parallel to <011> directions but may be misoriented slightly from this orientation. The shape of the grooves depends upon the crystalline direction and the particular chemical etchant chosen.

The various layers of the lasers described herein may be deposited on the substrate 18 using liquid phase epitaxy as described by Botez in U.S. Pat. No. 4,215,319, referred to above, and by H. F. Lockwood et al in U.S. Pat. No. 3,753,801, which is incorporated herein by reference.

The buffer layer 26 is typically composed of the same material and has the same conductivity type as the substrate 18 and is typically between about 0.5 and about 1 $\mu$m thick over the land 20a.

The first confinement layer 28 is composed of n-type $Al_wGa_{1-w}As$ where the fractional concentration w of Al is between about 0.25 and about 0.4 and is typically about 0.3. For the injection laser 10 this layer is typically between about 1 and about 2 $\mu$m thick while for the injection laser 50 the thickness is between about 1.5 and about 4 $\mu$m.

The guide layer 52 of the laser 50 is typically between about 0.5 and about 2 $\mu$m thick over the land 20a and is composed of n-type $Al_xGa_{1-x}As$ where the fractional concentration x of Al is less than that in the first confinement layer 28 and is typically about 0.20.

The active layer 30 is composed of $Al_yGa_{1-y}As$ where the fractional concentration y of Al is less than that in the guide layer 52 and the first confinement layer 28, and is between 0.0 and about 0.1. The active layer 30 preferably tapers in decreasing thickness in the lateral direction and is between about 0.05 and about 0.3 $\mu$m thick over the land 20a.

The second confinement layer 32 is typically between about 1 and 2 $\mu$m thick and is composed of p-type conductivity $Al_zGa_{1-z}As$ where the fractional concentration z of Al is between about 0.25 and about 0.4 and is typically between about 0.3 and about 0.35.

The capping layer 34 is typically composed of p-type GaAs between about 0.2 and about 1.5 $\mu$m thick.

It is to be understood that other combinations of Group III-V alloys may be used in the laser of the invention.

After the layers have been deposited a pair of channels extending through the capping and second confinement layers towards, but not intersecting, the active layer are formed using standard photolithographic and chemical etching techniques. As in the case of the grooves 24 in the substrate, the channel shape depends upon the crystal orientation and the chemical etchant. The anti-guiding regions 36 are then grown in the channels by liquid phase epitaxy or, alternatively, vapor phase epitaxy as disclosed by Olsen et al in U.S. Pat. No. 4,116,733, which is incorporated herein by reference.

The anti-guiding regions 36 may have a dovetail, vee or rectangular shape and are composed of $Al_rGa_{1-r}As$ where the fractional concentration r of Al is less than that of a second confinement layer 32 and is preferably between 0.0 and 0.25. These regions preferably have the opposite conductivity type to that of the second confinement layer 32 thereby providing back-biased p-n junctions in the lateral direction. Alternatively, these regions may be semi-insulating. In either case the current flow through the device is confined laterally. The center-to-center spacing of the antiguiding regions is between about 7 and 20 $\mu$m and is preferably about 14 $\mu$m. The width of the anti-guiding regions 36 is between about 4 and about 10 $\mu$m with the resulting mesa between the antiguiding regions between about 3 and 10 $\mu$m and preferably about 6 $\mu$m wide.

The electrically insulating layer 38 is preferably composed of $SiO_2$ about 0.1 $\mu$m thick and is deposited by pyrolytic decomposition of silane in oxygen or water vapor. The opening 40 is then formed through this layer over the land 20a using standard photolithographic and chemical etching techniques. The first electrical contact 42 is preferably composed of titanium, platinum and gold and is deposited over the electrically insulating layer 38 and over the capping layer 34 in the opening 40 using vacuum evaporation. The second electrical contact 44 may be composed of tin and silver, for example, and is deposited on the opposite surface 22 of the substrate 18 by sequential vacuum evaporation and sintering steps.

The threshold for oscillation in a particular mode of propagation and the fractional concentration of power in a particular mode depend upon the radiative mode losses which in turn depend upon the effective index of refraction in the lateral direction. For the laser 10 the effective lateral index of refraction is high over the land 20a, decreases with distance in the lateral direction due to the decreasing thickness of the active region and then increases due to the presence of the higher index anti-guiding regions 36. For the laser 50 the effective lateral index of refraction is high over the land 20a, decreases with distance in the lateral direction due to the decreasing thickness of the active region and then increases due to the increasing thickness of the guide layer and the presence of the higher index anti-guiding regions 36. The effect of the increasing effective index of refraction in the lateral direction is to introduce an anti-guiding effect in this direction. The sensitivity of a particular mode of propagation to this effect is strongly dependent on the spatial order of the mode; that is, higher order modes with their greater lateral extent have higher radiative losses than the fundamental mode. Thus, oscillation in higher order modes of propagation is suppressed relative to the oscillation in the fundamental lateral mode.

I claim:

1. In a semiconductor laser having a pair of end faces at least one of which is partially transparent to light and comprising a substrate having a pair of opposed major surfaces, with a pair of spaced, substantially parallel grooves in a first major surface with a land therebetween; a first confinement layer overlying the first major surface of the substrate and the surfaces of the grooves; an active layer overlying the first confinement layer; a second confinement layer overlying the active layer; and first and second electrical contacts overlying portions of the second confinement layer and the second major surface respectively; wherein the substrate and the first confinement layer are of one conductivity type and the second confinement layer is of the opposite conductivity type and wherein the index of refraction of the active layer at the wavelength of light emitted by the laser is greater than that of the first and second confinement layers;

the improvement which comprises a pair of spaced, substantially parallel anti-guiding regions on both sides of that portion of the second confinement layer over the land and extending a distance through the second confinement layer from a surface thereof towards, but not intersecting, the active layer, and having an index of refraction at said wavelength which is greater than that of the second confinement layer.

2. The laser of claim 1 wherein a guide layer having an index of refraction at said wavelength between that of the active layer and the first confinement layer and having the same conductivity type as the first confinement layer is interposed between the first confinement layer and the active layer.

3. The laser of claim 1 or 2 wherein a capping layer overlies the second confinement layer and an electrically insulating layer overlies the capping layer and has an opening therethrough to expose the surface of the capping layer over the land and wherein the first electrical contact overlies at least the exposed portion of the capping layer.

4. The laser of claim 1 or 2 wherein the anti-guiding regions have a center-to-center spacing between about 7 and about 20 micrometers and a width between about 4 micrometers and 10 micrometers.

5. The laser of claim 3 wherein the substrate is composed of n-type GaAs, the first confinement layer is composed of n-type AlGaAs, the second confinement layer is composed of p-type AlGaAs, the capping layer is composed of GaAS, and the anti-guiding regions are composed of $Al_rGa_{1-r}As$ where r is between about 0.0 and about 0.25.

6. The laser of claim 5 wherein the anti-guiding regions have opposite conductivity type to that of the second confinement layer.

7. The laser of claim 3 wherein a passivation layer overlies an end face of the body.

8. The laser of claim 7 wherein a laser reflector overlies the opposed end face of the body.

* * * * *